(12) United States Patent
Paul et al.

(10) Patent No.: US 11,650,276 B2
(45) Date of Patent: May 16, 2023

(54) METHOD FOR ACQUIRING MAGNETIC RESONANCE (MR) DATA

(71) Applicant: Siemens Healthcare GmbH, Erlangen (DE)

(72) Inventors: Dominik Paul, Bubenreuth (DE); Mario Zeller, Erlangen (DE); Flavio Carinci, Würzburg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/528,276

(22) Filed: Nov. 17, 2021

(65) Prior Publication Data

US 2022/0155397 A1 May 19, 2022

(30) Foreign Application Priority Data

Nov. 17, 2020 (DE) .......................... 102020214448.6

(51) Int. Cl.
*G01R 33/54* (2006.01)
*G01R 33/385* (2006.01)
*G01R 33/58* (2006.01)

(52) U.S. Cl.
CPC ....... *G01R 33/543* (2013.01); *G01R 33/3852* (2013.01); *G01R 33/58* (2013.01)

(58) Field of Classification Search
CPC ... G01R 33/543; G01R 33/3852; G01R 33/58
See application file for complete search history.

(56) References Cited

U.S. PATENT DOCUMENTS

| 5,023,552 | A | * | 6/1991 | Mehlkopf | G01R 33/56 324/309 |
| 5,442,290 | A | * | 8/1995 | Crooks | G01R 33/3852 324/309 |
| 5,828,216 | A | * | 10/1998 | Tschudin | H03G 1/0088 324/322 |
| 6,448,770 | B1 | * | 9/2002 | Liu | G01R 33/3621 324/309 |
| 7,157,908 | B1 | * | 1/2007 | Datsikas | G01R 33/4833 324/307 |
| 2002/0149365 | A1 | * | 10/2002 | DeMeester | G01R 33/583 324/309 |
| 2006/0244452 | A1 | * | 11/2006 | Den Boef | G01R 33/54 324/318 |
| 2010/0239142 | A1 | * | 9/2010 | Dannels | G06T 11/003 324/309 |
| 2010/0239151 | A1 | * | 9/2010 | Dannels | G01R 33/243 382/131 |
| 2017/0003363 | A1 | * | 1/2017 | Rosen | G01R 33/56 |
| 2017/0336487 | A1 | * | 11/2017 | Rehwald | G01R 33/3614 |

OTHER PUBLICATIONS

German Action dated Aug. 26, 2021, Application No. 10 2020 214 448.6.

* cited by examiner

*Primary Examiner* — Dixomara Vargas
(74) *Attorney, Agent, or Firm* — Banner & Witcoff Ltd.

(57) ABSTRACT

Techniques are described for acquiring MR data comprising first MR data and second MR data of an examination object using an MR control sequence and a magnetic resonance device comprising an amplifier unit and an analog-to-digital converter (ADC).

13 Claims, 5 Drawing Sheets

Figure 1:
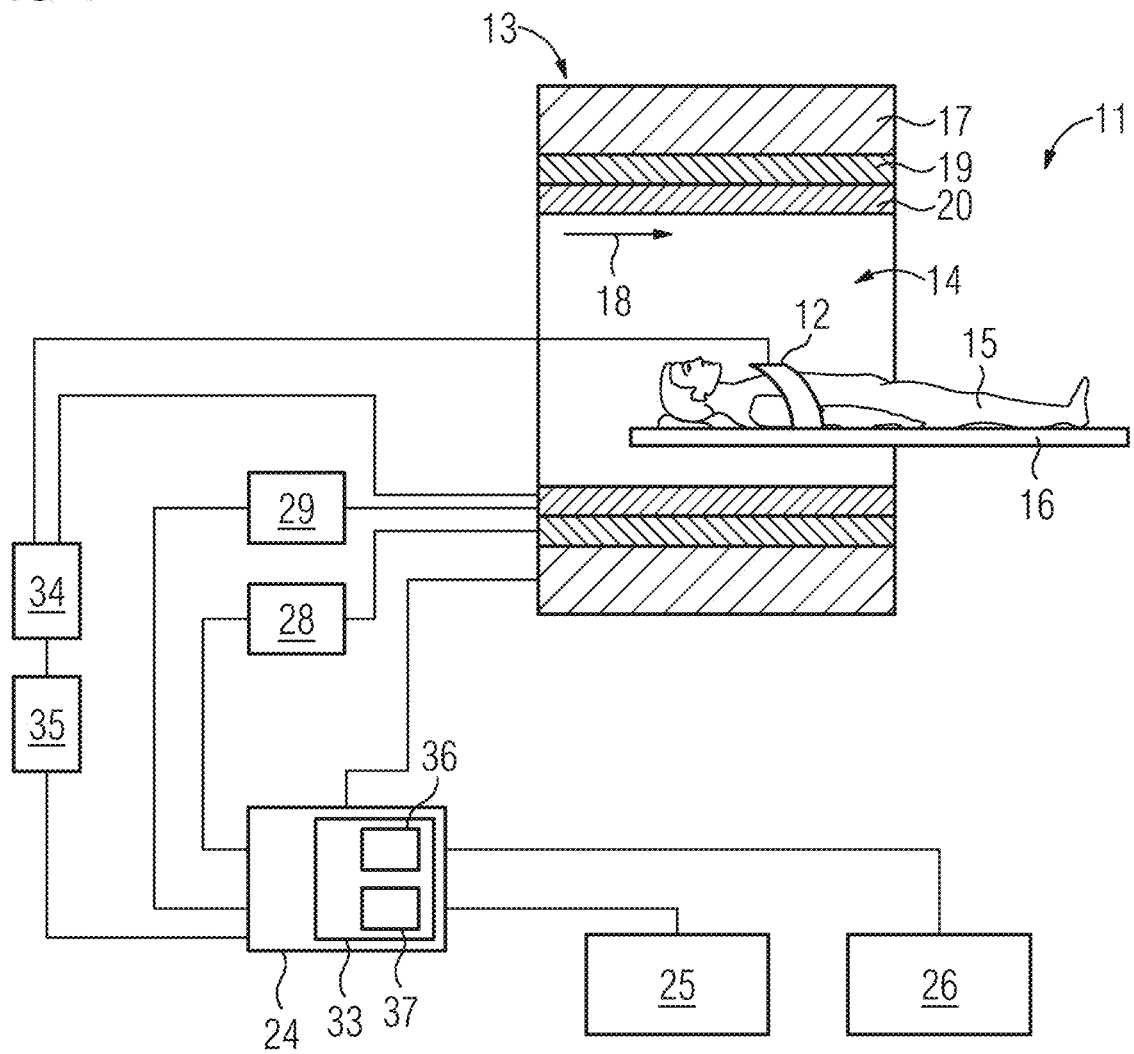
Figure 1:
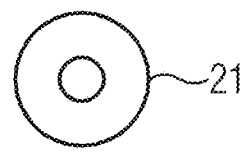

24: Control unit
25: Display unit
26: Input unit
28: Gradient control unit
29: Antenna control unit
33: Rx control unit
34: Amplifier unit
35: ADC
36: Verification unit
37: Selection unit

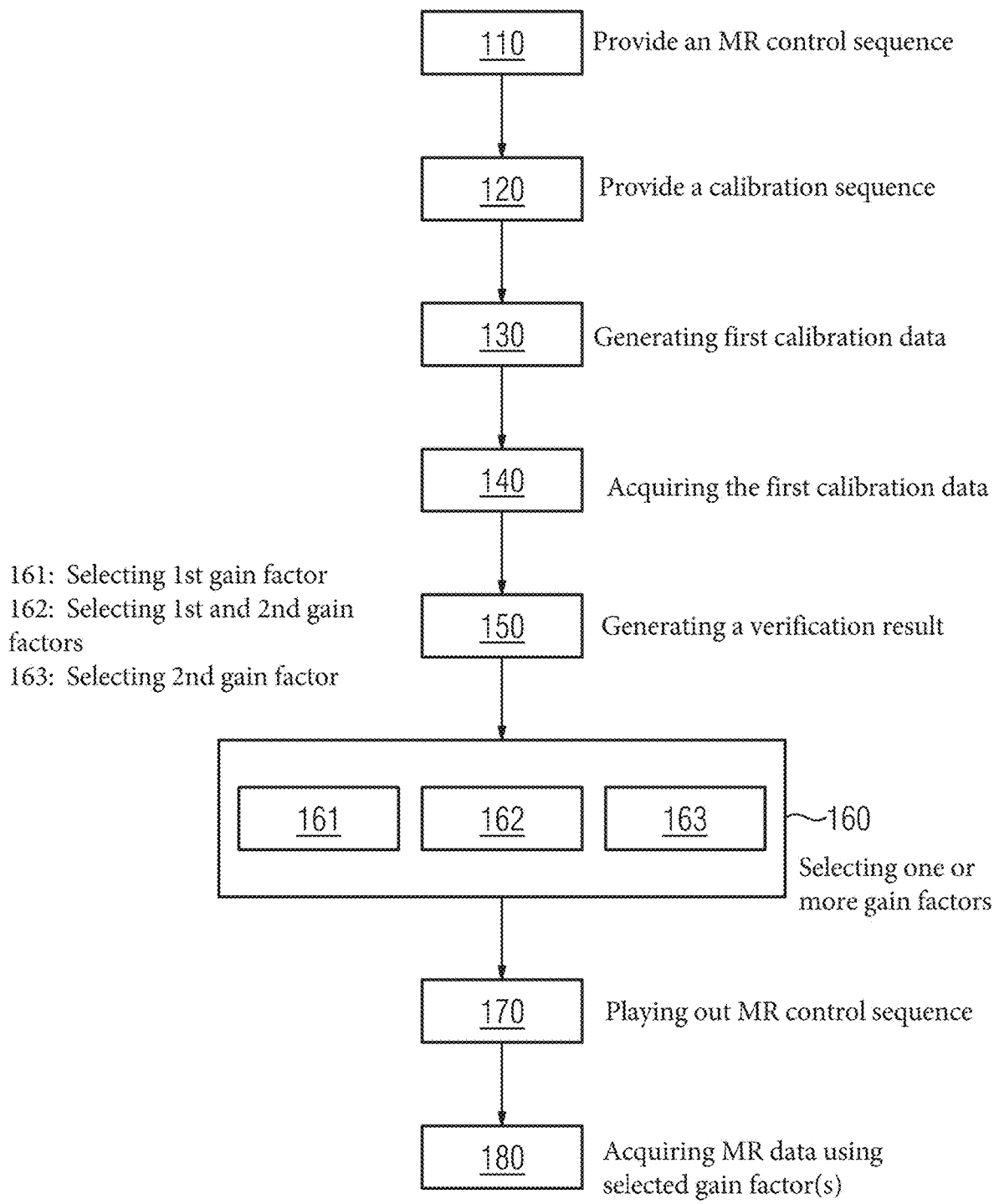

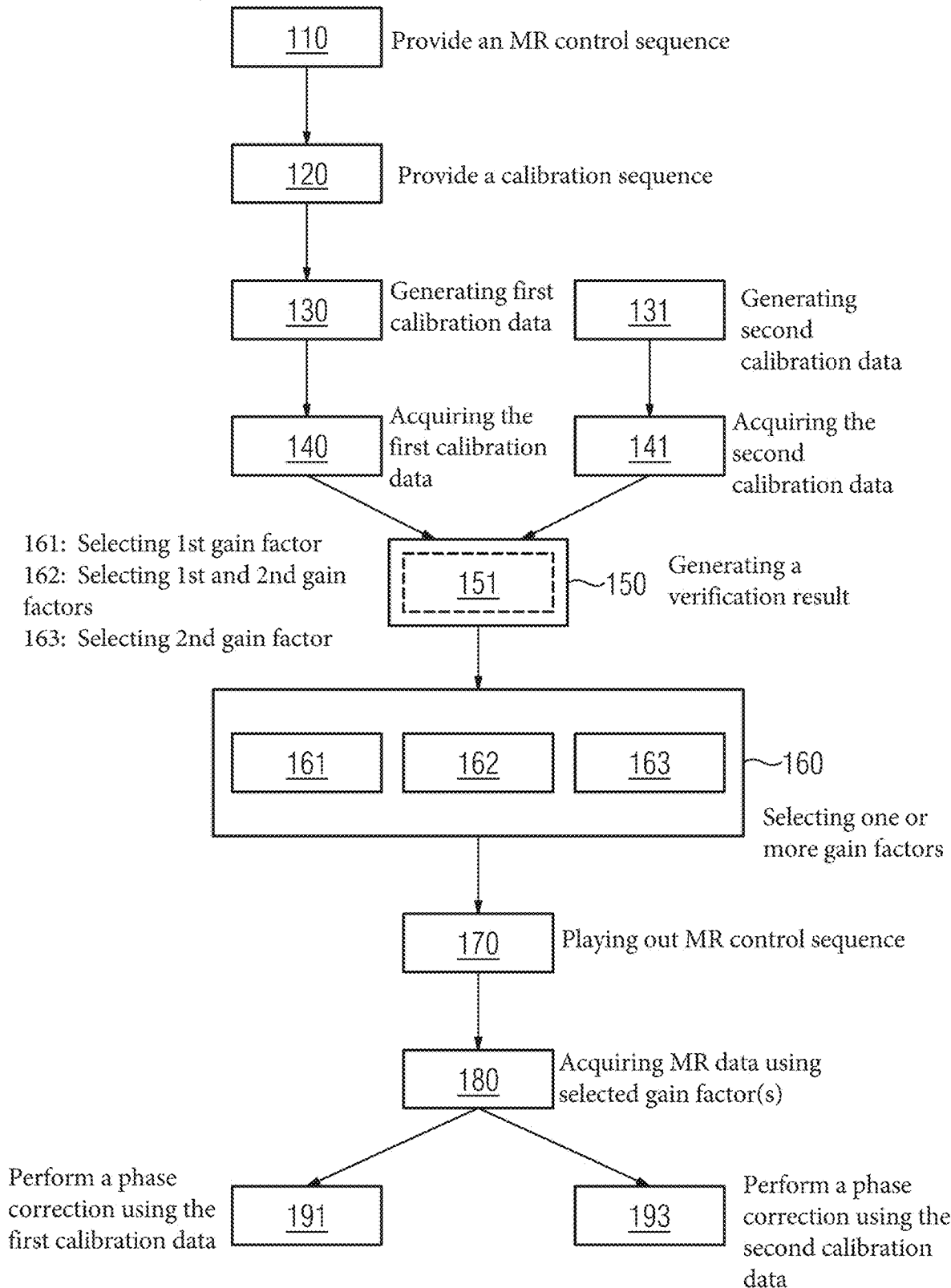

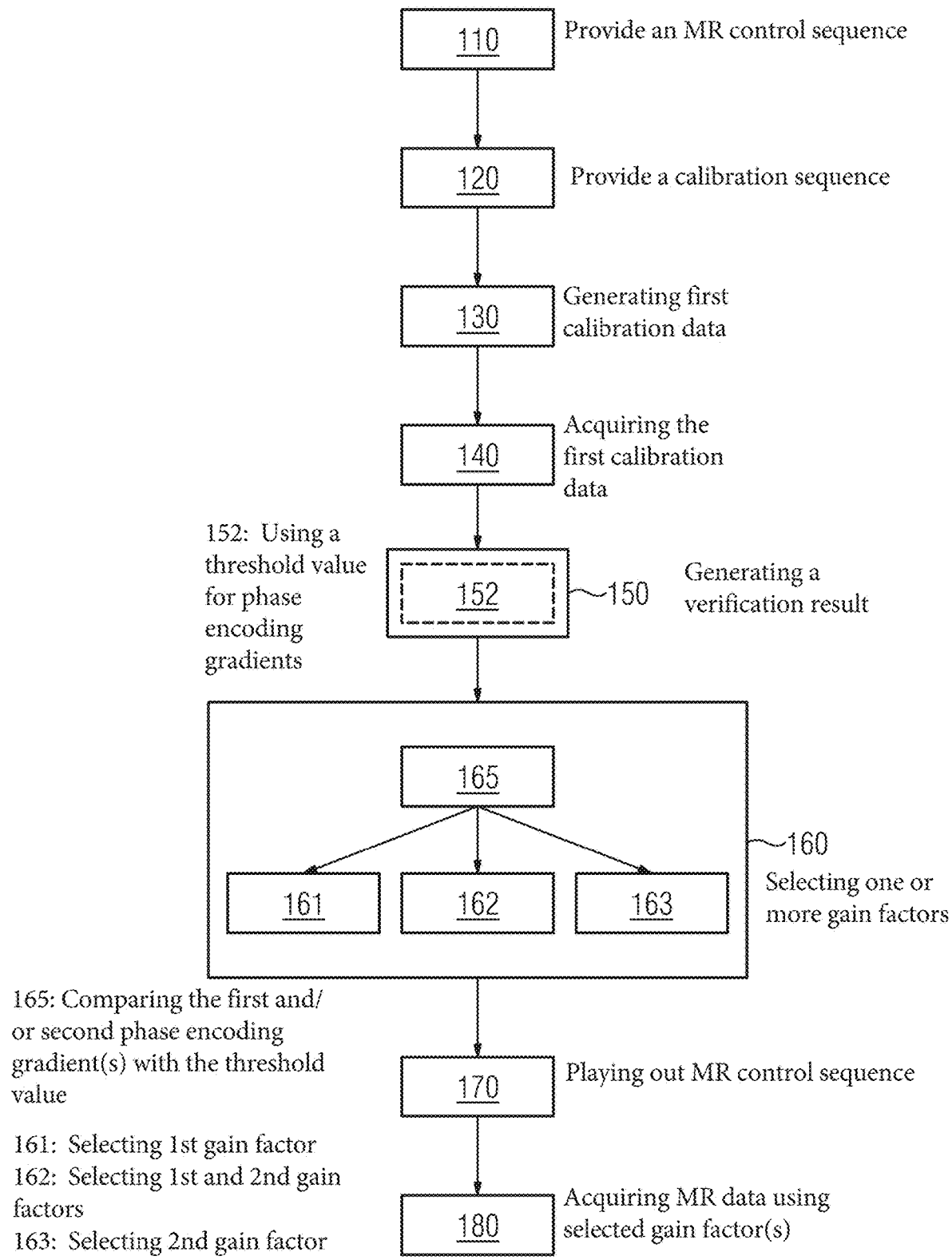

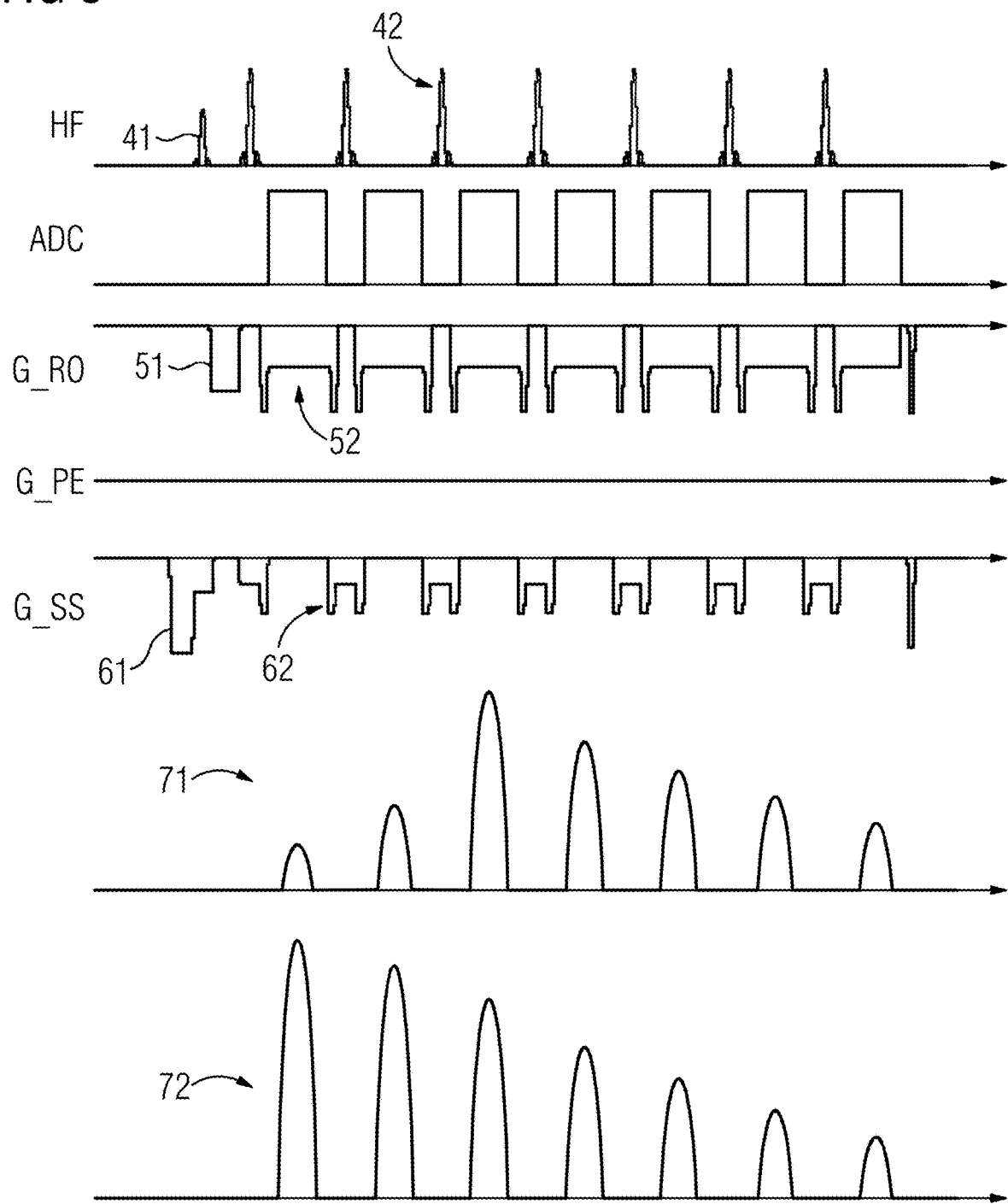

METHOD FOR ACQUIRING MAGNETIC RESONANCE (MR) DATA

CROSS-REFERENCE TO RELATED APPLICATIONS

The present application claims the benefit of the filing date of Germany patent application no. DE 10 2020 214 448.6, filed on Nov. 17, 2020, the contents of which are incorporated herein by reference in their entirety.

TECHNICAL FIELD

The disclosure relates to a method, a magnetic resonance device, a computer program product, and an electronically readable data carrier for acquiring magnetic resonance (MR) data.

BACKGROUND

In a magnetic resonance device, the body to be examined of an examination object, e.g. that of a patient, is usually exposed to a relatively high main magnetic field of e.g. 1.5, 3, 7, etc. tesla using a main magnet. In addition, a gradient coil unit is used to play out (i.e. execute or otherwise cause the transmission of) gradient pulses. Radio frequency (RF) pulses, e.g. excitation pulses, are then transmitted via a radiofrequency antenna unit by means of suitable antenna devices, causing the nuclear spins of particular atoms resonantly excited by these RF pulses to be tilted by a defined flip angle relative to the lines of force of the main magnetic field. On relaxation of the nuclear spins, RF signals, so-called magnetic resonance (MR) signals, are emitted, which are received by means of suitable RF antennas and then further processed. Finally, the desired image data can be reconstructed from the raw data acquired in this way.

For a particular measurement, a magnetic resonance control sequence (MR control sequence), also called a pulse sequence, must therefore be transmitted, which consists of a sequence of RF pulses, excitation pulses, and refocusing pulses, as well as coordinated gradient pulses to be transmitted in different gradient axes along different spatial directions. Suitably timed readout windows are set which define the time periods in which the induced magnetic resonance signals are detected.

The MR signals are typically detected by means of a RF antenna, from which the detected MR signals are forwarded to an amplifier unit and then to an analog-to-digital converter (ADC). The amplifier unit typically has two amplifier stages for two different gain factors, i.e. enables the acquired MR signals to be amplified with two different gain factors. Using a low gain factor can prevent overdriving in the event of high MR signals in the ADC. Using a high gain factor can improve the signal-to-noise ratio, especially for low MR signals. Conventionally, the amplifier stage, i.e. the gain factor, is chosen depending on a slice thickness of a two-dimensional slice of the three-dimensional region under examination. Below a threshold value for the slice thickness, the large gain factor is chosen to achieve a high signal-to-noise ratio, and above the threshold value for the slice thickness, the small gain factor is chosen to avoid overdriving.

SUMMARY

The object of the disclosure is to provide a particularly balanced method for acquiring MR data. This object is achieved by the various embodiments of the disclosure and features of the claims.

A method according to the disclosure for acquiring MR data from an examination object, comprising first MR data and second MR data, using an MR control sequence and a magnetic resonance device having an amplifier unit and an analog-to-digital converter (ADC) involves the following steps:

providing an MR control sequence designed to generate the first MR data characterized by a first phase encoding having a first phase encoding gradient and the second MR data characterized by a second phase encoding having a second phase encoding gradient, providing a calibration sequence, generating first calibration data from the examination object by playing out the calibration sequence, acquiring the first calibration data using a first gain factor in the amplifier unit, generating a check result by checking the acquired first calibration data for compatibility with a sensitivity range of the ADC, choosing at least one selected gain factor depending on the check result, comprising selection of the first gain factor for acquiring the MR data, or selection of the first gain factor for acquiring the first MR data and selection of a second gain factor for acquiring the second MR data, or selection of a second gain factor for acquiring the MR data, playing out the MR control sequence and acquiring the MR data of the examination object using the at least one selected gain factor in the amplifier unit.

Providing the MR control sequence and/or the calibration sequence may include accessing a storage unit on which the MR control sequence and/or the calibration sequence is stored. Providing the MR control sequence may include adapting at least one parameter of the MR control sequence. Providing the MR control sequence and/or the calibration sequence may include selecting the MR control sequence and/or a calibration sequence from a plurality of MR control sequences and/or calibration sequences.

Playing out the MR control sequence typically involves generating MR signals, such as e.g. raw data or MR data, present in raw data space, e.g. in k-space. Accordingly, MR data is typically provided as raw data generated using the MR control sequence. The MR control sequence typically provides phase encoding in a first spatial direction, e.g. in the phase encoding direction, which phase encoding allows spatial encoding and thus spatial resolution in the first spatial direction when the MR data is reconstructed into image space.

The MR data comprises first MR data and second MR data. The first MR data may be characterized in that the first MR data is generated using a first phase encoding gradient. The first phase encoding gradient may be characterized in that it is greater than or less than a defined threshold value. For instance, the first MR data may be generated using different first phase encoding gradients, wherein the different first phase encoding gradients are greater than or less than the defined threshold. The first MR data typically comprises MR data of at least one line of raw data space. The MR data typically comprises MR data from a sub-region of the raw data space, which sub-region may be defined by the first phase encoding gradient. The second MR data may be characterized in that the second MR data is generated using a second phase encoding gradient. The second phase encoding gradient may be characterized in that it is greater than or less than a defined threshold value. For instance, the second MR data may be generated using different second phase encoding gradients, wherein the different second phase encoding gradients are greater than or less than the defined threshold. The second MR data typically comprises MR data of at least one line of raw data space. The MR data typically comprises MR data from a sub-region of the raw data space, which sub-region may be defined by the second phase encoding gradient.

The first phase encoding gradient and the second phase encoding gradient may be separated from one another by the threshold value.

The first calibration data is typically provided as raw data generated using the calibration sequence. The calibration sequence is typically designed to generate raw data, which raw data cannot be reconstructed into image data, e.g. into diagnostic image data. The duration of the calibration sequence is typically less than 20%, e.g. less than 10%, less than 5%, etc. of the duration of the MR control sequence. The acquisition of the first calibration data typically involves amplifying the generated first calibration data using the first gain factor. The acquisition of the first calibration data typically comprises digitizing the first calibration data using the ADC.

The sensitivity range of the ADC typically specifies a value range for the acquisition of MR data and/or first calibration data and/or second calibration data. MR data and/or first calibration data and/or second calibration data outside the sensitivity range of the ADC is typically not detected and/or detected in a distorted manner, e.g. due to overdriving.

The checking of the acquired first calibration data for compatibility with a sensitivity range of the ADC typically includes checking the consistency of the first calibration data. The checking of the acquired first calibration data may include providing modeled calibration data.

The modeled calibration data may be determined taking into account the calibration sequence and/or the first gain factor and/or the sensitivity range of the ADC. The checking of the acquired first calibration data for compatibility with a sensitivity range of the ADC may comprise comparing the acquired first calibration data with the modeled calibration data. The check result may include e.g. information as to whether the acquired first calibration data is within and/or outside the sensitivity range of the ADC.

A gain factor to be used for acquiring the MR data, e.g. the first MR data and/or the second MR data, is selected taking the check result into account. For example, the first gain factor may be chosen for acquiring the first MR data. Choosing at least one selected gain factor may include providing the second gain factor. The first gain factor is typically different from the second gain factor. Choosing the at least one selected gain factor may include taking into account the MR control sequence and/or taking into account a relationship between the MR control sequence and the calibration sequence.

The first calibration data and/or the second calibration data and/or the MR data is typically generated and/or acquired from an examination object. The first calibration data and/or the second calibration data and/or the MR data is typically acquired in the course of scanning of an examination object via the magnetic resonance device.

The advantage of the method according to the disclosure is that a gain factor for the subsequent acquisition of the MR data is chosen depending on first calibration data specific to the examination object and/or the region under examination and/or the sensitivity range of the ADC and/or the intensity of the first calibration data and/or the strength of the phase encoding. This provides amplification of the MR data that is balanced and individually tailored to the examination. For instance, this enables overdriving of the signal to be prevented. The signal-to-noise ratio is also increased.

As an example, the method according to the disclosure allows a gain factor to be chosen depending on the phase encoding gradient and/or allows the gain factor matched to the phase encoding gradient to be chosen. The acquisition of the first MR data from a first sub-region of raw data space characterized by the first phase encoding gradient may be performed using the first gain factor if chosen accordingly. The acquisition of the second MR data from a second sub-region of the raw data space characterized by the second phase encoding gradient may be performed using the second gain factor, if chosen accordingly. Consequently, the method according to the disclosure provides a gain factor specific to a phase encoding gradient. For example, in regions of raw data space having a low MR signal, which typically results in a low signal-to-noise ratio, a larger gain factor may be chosen than in regions of raw data space with a high MR signal, which typically results in overdriving of the ADC. Generating the check result and choosing at least one selected gain factor typically do not extend the scan time of the examination object.

In one embodiment of the method, the first gain factor is greater than the second gain factor, and the first phase encoding gradient is greater than the second phase encoding gradient. A higher signal is typically present in the center of raw data space, which may result in overdriving in the ADC, adversely affecting the quality of the MR data reconstructed into image data. In the periphery of raw data space, a lower signal is typically present, resulting in a low signal-to-noise ratio, adversely affecting the quality of MR data reconstructed into image data. The larger the phase encoding gradient, the greater the distance of the MR data from the center of raw data space. Consequently, this embodiment allows a larger first gain factor to be used for MR data at the periphery of raw data space and a smaller second gain factor to be used for MR data near the center of raw data space. Thus, MR data with a low signal-to-noise ratio may be efficiently amplified while avoiding overdriving of MR data with a high MR signal in the ADC.

In one embodiment of the method, the MR control sequence and the calibration sequence are multi-echo sequences, and the acquired first calibration data comprises MR signals from at least two echoes having different durations relative to the excitation time. The intensity of the MR signals typically decreases with an increasing time duration between the excitation time and the echo causing the MR signal, which typically applies to the MR control sequence and the calibration sequence. The MR data may comprise e.g. MR signals from at least two echoes having different durations relative to the excitation time. The MR data and the first calibration data typically comprise MR signals from echoes having the same time duration relative to the corresponding excitation time of the MR control sequence and the calibration sequence.

The MR data and the first calibration data may e.g. have the same time difference between the excitation pulse and the first echo. The excitation time is typically characterized by the RF excitation pulse. For example, the multi-echo sequence may be an echo-planar gradient echo (EPI) MR control sequence or a turbo spin echo (TSE) MR control sequence.

This embodiment enables the first calibration data to be correlated with the MR data. For instance, a time duration between excitation time and an echo generating the first calibration data and/or MR data may be taken into account when choosing the at least one selected gain factor. Multi-echo sequences already typically require calibration data acquired via a calibration sequence to use MR data correction. According to this embodiment, the generation and acquisition of first calibration data is therefore possible without requiring additional time.

One embodiment of the method provides that the checking of the acquired first calibration data includes analyzing the time course of the intensity of the signals of the at least two echoes with respect to a continuous reduction, e.g. with respect to an exponential reduction. The time course of the intensity of the signals of the acquired first calibration data typically exhibits an exponential decay provided that the first calibration data amplified using the first gain factor is completely encompassed by the sensitivity range of the ADC. If the time course of the intensity of the signals of the acquired first calibration data at least partially exhibits an increase, this indicates that the first calibration data amplified using the first gain factor is only partially encompassed by the sensitivity range of the ADC. Then, for example choosing at least one selected gain factor may involve selecting a second gain factor for acquiring the MR data. Alternatively, choosing at least one selected gain factor may include selecting the first gain factor for acquiring the first MR data and selecting a second gain factor for acquiring the second MR data. This embodiment provides particularly efficient checking of the acquired first calibration data with respect to compatibility with a sensitivity range of the ADC.

In one embodiment of the method, the calibration sequence corresponds at least in part to the MR control sequence, omitting the phase encoding. The first calibration data may corresponds to a projection of the MR data if acquired using the first gain factor. For instance, parameters determining the region under examination and/or contrast of the MR data in the calibration sequence and the MR control sequence may coincide. This embodiment allows the first calibration data to have the signal intensity expected in the MR data. This embodiment provides particularly good prediction of the signal response of the MR data when the MR control sequence is played out.

If the region under examination comprises a joint and a proton density weighted MR control sequence is chosen to acquire the MR data, the first calibration data will have a relatively high signal intensity, e.g. compared to a region under examination comprising a head, as would also be expected in the corresponding MR data to be acquired with the MR control sequence using the first gain factor. If an MR control sequence with fat saturation were selected, a relatively low signal intensity would be expected in the joint compared to a head. This embodiment enables such acquisition parameters to be individually taken into account and thus provides a particularly good signal-to-noise ratio.

One embodiment of the method additionally comprises generating second calibration data by playing out the calibration sequence and acquiring the second calibration data using the second gain factor in the amplifier unit. This embodiment optionally includes generating a check result by checking the acquired second calibration data for compatibility with the sensitivity range of the ADC. This embodiment advantageously ensures that, when the second gain factor is selected, overdriving of the ADC is avoided during acquisition of the MR data and/or of the second MR data. The second calibration data may comprise information about the suitability of the second gain factor for acquiring the MR data. The second calibration data may be used for choosing the at least one selected gain factor.

One embodiment of the method provides that the checking of the acquired first calibration data involves comparing the acquired first calibration data and the acquired second calibration data, e.g. determining a scaling factor between the acquired first calibration data and the acquired second calibration data. If the first calibration data and the second calibration data do not behave linearly with respect to one another, this typically indicates that at least the first calibration data amplified by the first gain factor is not encompassed by the sensitivity range of the ADC. Overdriving of the ADC is then typically to be expected if the first gain factor is selected. This embodiment allows reliable and accurate testing of the compatibility of the first gain factor with the ADC's sensitively range.

In one embodiment of the method, choosing the at least one selected gain factor includes selecting of the first gain factor for acquiring the MR data if the acquired first calibration data is within the sensitivity range of the ADC. The first gain factor may be greater than the second gain factor. This embodiment ensures a particularly high signal-to-noise ratio of the MR data without overdriving the ADC.

One embodiment of the method additionally includes phase correction of the MR data using the second calibration data. If the acquired second calibration data is outside the sensitivity range of the ADC, the second calibration data includes the information required for phase correction. This embodiment allows efficient use of the second calibration data for two different purposes, and thus ensures particularly good quality of MR data in a short scan time.

In one embodiment of the method, the choice of the at least one selected gain factor involves selecting the first gain factor for acquiring the first MR data and selecting a second gain factor for acquiring the second MR data if the first calibration data is partially outside the sensitivity range of the ADC. If the first calibration data is partially outside the sensitivity range of the ADC, this typically indicates that only the portion of the first calibration data with particularly high signal intensity, as typically occurs in the center of raw data space, is not encompassed by the sensitivity range of the ADC. According to this embodiment, the at least one selected gain factor is typically chosen depending on the position in raw data space of the MR data to be acquired, e.g. the first MR data and the second MR data. In this way, MR data with a low signal-to-noise ratio may be efficiently amplified without overdriving of MR data with a high MR signal in the ADC.

One embodiment of the method involves providing a threshold value for phase encoding gradients, wherein choosing the at least one selected gain factor comprises comparing the first phase encoding gradient and/or the second phase encoding gradient with the threshold value. Providing the threshold value for phase encoding gradients may comprise determining the threshold value based on first calibration data within and/or outside the sensitivity range of the ADC.

If the first phase encoding gradient and/or the second phase encoding gradient is greater than the threshold value, the first gain factor is typically used to acquire the first MR data and/or the second MR data.

If the first phase encoding gradient and/or the second phase encoding gradient is less than the threshold value, the second gain factor is typically used to acquire the first MR data and/or the second MR data.

The second gain factor is typically less than the first gain factor. This embodiment allows a larger first gain factor to be used for MR data at the periphery of raw data space, and a smaller second gain factor to be used for MR data near the center of raw data space. This ensures efficient amplification of MR data with low signal-to-noise ratio while avoiding overdriving of MR data with high MR signal.

The disclosure also proceeds from a magnetic resonance device comprising an amplifier unit, an analog-to-digital converter (ADC), and a control unit comprising a receive control unit. The control unit is designed to carry out a method according to the disclosure for acquiring MR data.

For this purpose, the magnetic resonance device, e.g. the control unit and/or the receive control unit, typically has an input, a processor unit, and an output. Via the input, an MR control sequence, a calibration sequence, first calibration data, a first gain factor, and/or a second gain factor may be supplied to the control unit. Other functions, algorithms, or parameters required in the method may be provided to the control unit via the input. The check result, the selected gain factor, and/or further results of an embodiment of the method according to the disclosure may be provided via the output. The control unit may be incorporated in the magnetic resonance device. The control unit may also be installed separately from the magnetic resonance device. The control unit may be connected to the magnetic resonance device.

Embodiments of the magnetic resonance device according to the disclosure are analogous to the embodiments of the method according to the disclosure. The magnetic resonance device may have further control components, which are necessary and/or advantageous for carrying out a method according to the disclosure. The magnetic resonance device may also be designed to transmit control signals and/or receive control signals and/or process control signals to perform a method according to the disclosure. The receive control unit may be part of the control unit of the magnetic resonance device according to the disclosure. Computer programs and additional software, by means of which the processor unit of the control unit automatically controls and/or executes a process sequence of a method according to the disclosure, may be stored on a memory unit of the control unit.

A computer program product according to the disclosure is directly loadable to a memory unit of a programmable control unit and has program code means for carrying out a method according to the disclosure when the computer program product is executed in the control unit. As a result, the method according to the disclosure maybe carried out quickly, robustly, and in an identically-repeatable manner. The computer program product is configured such that it may carry out the method steps according to the disclosure via the control unit. The control unit in each case has the necessary facilities, such as a corresponding main memory, an appropriate graphics card, or an appropriate logic unit, so that the respective method steps maybe carried out efficiently. The computer program product is stored, for example, on an electronically readable medium (e.g. a non-transitory computer-readable medium) or installed on a network or server, from where it may be loaded into the processor of a local control unit which may be directly connected to the magnetic resonance device or implemented as part of the magnetic resonance device.

Control information for the computer program product may also be stored on an electronically-readable data carrier (e.g. a non-transitory computer-readable medium). The control information of the electronically readable data carrier may be designed to carry out a method according to the disclosure when the data carrier is used in a control unit of a magnetic resonance device. Examples of electronically readable data carriers are a DVD, a magnetic tape or a USB stick, etc., on which electronically readable control information, e.g. software, is stored. If this control information (software) is read from the data carrier and stored in a control unit and/or receive control unit of a magnetic resonance device, all the embodiments of the methods according to the disclosure described above may be carried out (i.e. executed, performed, etc.).

The disclosure also proceeds from an electronically readable data carrier, on which a program is stored, which is designed to carry out a method for acquiring MR data.

The advantages of the magnetic resonance device according to the disclosure, of the computer program product according to the disclosure, and of the electronically readable data carrier according to the disclosure essentially correspond to the advantages of the method according to the disclosure for acquiring MR data as detailed above. Features, advantages, or alternative embodiments mentioned herein are likewise transferable to the other claimed objects and vice versa.

BRIEF DESCRIPTION OF THE DRAWINGS/FIGURES

Further advantages, features, and details of the disclosure will emerge from the embodiments described below and the accompanying drawings in which:

FIG. 1 schematically illustrates an example magnetic resonance device according to the disclosure, FIG. 2 shows an example flowchart of a first embodiment of a method according to the disclosure, FIG. 3 shows an example flow chart of a second embodiment of a method according to the disclosure, FIG. 4 shows an example flow chart of a third embodiment of a method according to the disclosure, and FIG. 5 schematically illustrates an example calibration sequence and resulting calibration data according to the disclosure.

DETAILED DESCRIPTION

FIG. 1 schematically illustrates an example magnetic resonance device 11 according to the disclosure. The magnetic resonance device 11 comprises a detector unit constituted by a magnet unit 13 having a main magnet 17 for generating a powerful and, e.g., constant main magnetic field 18. The magnetic resonance device 11 also comprises a cylindrical patient tunnel 14 for accommodating a patient 15, the patient tunnel 14 being cylindrically enclosed in a circumferential direction by the magnet unit 13. The patient 15 may be slid into the patient tunnel 14 by means of a patient positioning apparatus 16 of the magnetic resonance device 11. For this purpose, the patient positioning apparatus 16 comprises a patient table, which is movably disposed within the magnetic resonance unit 11.

The magnet unit 13 further comprises a gradient coil unit 19 (e.g. gradient generation circuitry, which may include one or more processors, processing circuitry, hardware, software, executable instructions, or combinations of these) used for spatial encoding during imaging. The gradient coil unit 19 is controlled via a gradient control unit 28 (e.g. a computing device, controller, and/or control circuitry, which may include one or more processors, processing circuitry, hardware, software, executable instructions, or combinations of these). In addition, the magnet unit 13 has a RF antenna unit 20 (e.g. RF generation circuitry, which may include one or more processors, processing circuitry, hardware, software, executable instructions, or combinations of these) which in the case shown is implemented as a body coil permanently incorporated in the magnetic resonance device 11, and a RF antenna control unit 29 (e.g. a computing device, controller, and/or control circuitry, which may include one or more processors, processing circuitry, hardware, software, executable instructions, or combinations of these) for exciting a polarization which arises in the main magnetic field 18 generated by the main magnet 17. The RF antenna unit 20 is controlled by the radiofrequency antenna control unit 29 and injects RF pulses into an examination space essentially constituted by the patient tunnel 14.

The magnetic resonance device 11 comprises a receive coil unit 12 which is typically implemented as a RF antenna (e.g. receiver coils) and/or is disposed such that it surrounds a region to be examined of the patient 15. The receive coil unit 12 is implemented to (i.e. configured and/or designed to) receive and/or detect RF signals arising in the patient 15 as a result of the RF pulses, i.e. the emitted magnetic resonance signals. The receive coil unit 12 is implemented to detect and/or transmit the generated MR data and/or the generated first calibration data and/or the generated second calibration data to an amplifier unit 34 (e.g. amplifier circuitry, which may include one or more processors, processing circuitry, hardware, software, executable instructions, or combinations of these). The receive coil unit 12 may be implemented as a local RF antenna, as in the case illustrated. The RF antenna unit 20 may also be used as the receive coil unit 12 and/or the receive coil unit 12 may be incorporated in the RF antenna unit 20.

The magnetic resonance device 11 additionally comprises the amplifier unit 34 as noted above, which is implemented to amplify the magnetic resonance signals received by the receive coil unit 12 using a gain factor. The amplifier unit 34 is implemented to amplify and/or acquire the generated MR data and/or the generated first calibration data and/or the generated second calibration data. Acquisition of the generated MR data and/or the generated first calibration data and/or the generated second calibration data typically involves amplification. The amplifier unit 34 is typically connected to the receive coil unit 12 and/or the analog-to-digital converter (ADC) 35. The amplifier unit 34 may be implemented to forward the amplified magnetic resonance signals to an analog-to-digital converter (ADC) 35 comprised by the magnetic resonance device 11. The ADC 35 may be implemented to digitize the amplified magnetic resonance signals.

The magnetic resonance device 11 has a control unit 24 (e.g. a computing device, controller, and/or control circuitry, which may include one or more processors, processing circuitry, hardware, software, executable instructions, or combinations of these) for controlling the main magnet 17, the gradient control unit 28, and the RF antenna control unit 29. The control unit 24 centrally controls the magnetic resonance device 11, e.g. executing MR control sequences. For instance, the control unit 24 is implemented to initiate a playout of the calibration sequence and/or the MR control sequence, i.e. to cause the magnetic resonance device 11 to be controlled according to the calibration sequence and/or the MR control sequence.

The control unit 24 also comprises a reconstruction unit (not shown in detail) for reconstructing medical image data acquired during the magnetic resonance examination. The magnetic resonance device 11 has a display unit 25. Control information, such as control parameters, as well as reconstructed image data may be displayed for a user on the display unit 25, e.g. via at least one monitor. The magnetic resonance device 11 also has an input unit 26, by means of which information and/or control parameters may be entered by a user during a measurement process. The control unit 24 may incorporate the gradient control unit 28 and/or RF antenna control unit 29 and/or the display unit 25 and/or the input unit 26.

The control unit 24 additionally comprises a receive control unit 33 (e.g. a computing device, controller, and/or control circuitry, which may include one or more processors, processing circuitry, hardware, software, executable instructions, or combinations of these). The receive control unit 33 is typically connected to the amplifier unit 34. The receive control unit 33 may comprise a verification unit 36 and a selection unit 37. The verification unit 36 is implemented to generate a verification result by checking the acquired first calibration data for compatibility with a sensitivity range of the ADC 35. The selection unit 37 is implemented to select at least one selected gain factor depending on the verification result.

The control unit 24, e.g. the receive control unit 33, is implemented to provide the amplifier unit 34 with the selected gain factor and/or to control the amplifier unit 34 according to the selected gain factor. For instance, the control unit 24 is implemented to control the playout of the MR control sequence and thus the generation of the MR data. The control unit 24 is typically designed to control the playout of the calibration sequence and thus the generation of the first calibration data and/or the second calibration data. The receive control unit 33 is typically designed to control the acquisition of the MR data and/or the first calibration data and/or the second calibration data.

The receive control unit 33 and/or the control unit 24 may comprise a phase correction unit (not shown in detail) which is implemented to phase correct the MR data using the first calibration data and/or the second calibration data.

The control unit 24 is also implemented to carry out a method for acquiring MR data. For this purpose, the receive control unit 33 comprises computer programs and/or software directly loadable to a memory unit (not shown in detail) of the receive control unit 33, having any suitable type of executable instructions and/or program(s) to carry out a method for acquiring MR data when the computer programs and/or software are executed in the receive control unit 33. For this purpose, the receive control unit 33 comprises one or more processors (not shown in detail) designed to execute the computer programs and/or software. Alternatively, the computer programs and/or software may be stored on an electronically readable data carrier 21 provided separately from the control unit 24 and/or the receive control unit 33, wherein the receive control unit 33 may access the data stored on the electronically readable data carrier 21 via a data network.

The magnetic resonance device 11 shown may of course comprise additional, fewer, or alternate components normally present in magnetic resonance devices 11. Moreover, the general mode of operation of a magnetic resonance device 11 will be well-known to persons skilled in the art, so that a detailed description of the further components may be dispensed. The magnetic resonance device 11 is thus implemented together with the control unit 24 and/or receive control unit 33 to carry out any of the methods according to the disclosure.

A method for acquiring MR data may also be in the form of a computer program product that implements the method on the control unit 24 when executed on the control unit 24. An electronically readable data carrier 21 having electronically readable control information stored thereon may likewise be present, comprising at least one such computer program product as described herein and designed to perform out any of the methods described herein when the electronically readable data carrier 21 is used in a control unit 24 of a magnetic resonance device 11.

FIG. 2 shows an example flowchart of a first embodiment of a method according to the disclosure. As further discussed herein, the example flowchart shown in FIG. 2 may is identified with acquiring MR data comprising first MR data and second MR data using an MR control sequence and the magnetic resonance device 11.

In an initial method step 110, the MR control sequence is provided, which is designed to generate the first MR data and the second MR data. Method step 120 includes providing a calibration sequence. Method steps 110 and 120 maybe at least partially simultaneous and/or consecutive. Method step 130 includes generating first calibration data by playing out (i.e. executing) the calibration sequence. Method step 140 includes acquiring the first calibration data using a first gain factor in the amplifier unit 34. Acquiring the first calibration data, e.g. method step 140, may also comprise acquiring the first calibration data using the receive coil unit 12. Acquiring the first calibration data, e.g. method step 140, typically involves forwarding the first calibration data from the receive coil unit 12 to the amplifier unit 34.

Method step 150 comprises generating a verification result by checking the acquired first calibration data for compatibility with a sensitivity range of the ADC 35. Method step 160 comprises selecting at least one selected gain factor depending on the verification result from one of the following three options. Option 161 comprises selecting the first gain factor for acquiring the MR data. Option 162 comprises selecting the first gain factor for acquiring the first MR data, and selecting a second gain factor for acquiring the second MR data. Option 163 comprises selecting a second gain factor for acquiring the MR data. Method step 170 comprises playing out the MR control sequence. The subsequent method step 180 comprises acquiring the MR data using the at least one selected gain factor in the amplifier unit 34.

Acquiring the MR data and/or the first calibration data and/or the second calibration data typically comprises acquiring the generated MR data and/or the first calibration data and/or the second calibration data via the receive coil unit 12. Acquiring the MR data and/or the first calibration data and/or the second calibration data typically comprises forwarding the acquired MR data and/or the first calibration data and/or the second calibration data from the receive coil unit 12 to the amplifier unit 34. Acquiring the first calibration data typically comprises amplifying the first calibration data using the first gain factor. Acquiring the first calibration data typically comprises amplifying the second calibration data using the second gain factor. Acquiring the MR data typically comprises amplifying the MR data using the at least one selected gain factor.

Acquiring the MR data and/or the first calibration data and/or the second calibration data typically comprises converting the amplified MR data and/or the first calibration data and/or the second calibration data from an analog signal into a digital signal using the ADC 35.

FIG. 3 shows an example flow chart of a second embodiment of a method according to the disclosure. This second embodiment differs from the first embodiment with respect to the following optional process steps, which may also only be added individually to the first embodiment.

Method step 131 comprises generating second calibration data by playing out the calibration sequence. Method step 141 comprises acquiring the second calibration data using the second gain factor in the amplifier unit 34.

Verifying the acquired first calibration data according to method step 150 may comprise, using method step 151, comparing the acquired first calibration data and the acquired second calibration data, e.g. determining a scaling factor between the acquired first calibration data and the acquired second calibration data.

In method step 160, for choosing at least one selected gain factor, method step 161, i.e. selection of the first gain factor for acquiring the MR data, may be provided if the acquired first calibration data is within the sensitivity range of the ADC 35. For instance, a phase correction of the acquired MR data may be performed with method step 191 using the first calibration data.

In method step 160, when the at least one selected gain factor is chosen, method step 163, i.e. selection of the second gain factor for acquiring the MR data, may be provided if the acquired first calibration data is outside the sensitivity range of the ADC 35. For instance, a phase correction of the acquired MR data may be performed with method step 193 using the second calibration data.

In method step 160, when the at least one selected gain factor is selected, method step 162, i.e. selection of the first gain factor for acquiring the first MR data and selection of a second gain factor for acquiring the second MR data, may be provided if the first calibration data is partially outside the sensitivity range of the ADC 35. FIG. 4 shows an example flow chart of a third embodiment of a method according to the disclosure. This third embodiment differs from the first embodiment with respect to the following optional method steps, which may also be added individually to the first embodiment. In method step 150, the generation of a verification result optionally comprises providing, using method step 152, a threshold value for phase encoding gradients. Method step 160 then comprises, using method step 165, comparing the first phase encoding gradient and/or the second phase encoding gradient with the threshold value.

FIG. 5 schematically illustrates an example calibration sequence and resulting calibration data according to the disclosure. The calibration sequence is shown as a time sequence, comprising RF pulses emitted by the RF antenna unit 20, and including an excitation pulse 41 and a plurality of refocusing pulses 42. The excitation pulse 41 characterizes the excitation time. Between the refocusing pulses, the calibration sequence provides readout gradients 52, which are output by the gradient coil unit 19 in the readout direction G_RO. A rewind gradient 51 is provided between the excitation pulse 41 and the first of the plurality of refocusing pulses 42. The refocusing pulses 42 each generate an echo, i.e. an MR signal.

Simultaneously with the excitation pulse 41 and the refocusing pulses 42, the calibration sequence provides slice selection gradients 61, 62, which are output by the gradient coil unit 19 in the slice selection direction G_SS. The calibration sequence does not provide phase encoding, which means that no magnetic field gradient is generated by the gradient coil unit 19 in the phase encoding direction G_PE. MR signals are detected by the receive coil unit 12 and/or the amplifier unit 34 and/or the ADC 35 simultaneously with the readout gradients 52. The MR signals occur each time echoes are created, which means that the calibration sequence shown is implemented as a multi-echo sequence.

The MR control sequence may differ from the calibration sequence shown only with respect to phase encoding, i.e. magnetic field gradients in the phase encoding direction G_PE.

FIG. 5 also shows the first calibration data 71 acquired using the first gain factor and the second calibration data 72 acquired using the second gain factor, the first gain factor being greater than the second gain factor. In the case shown, the first calibration data 71 in each case comprises MR signals acquired for seven echoes, each having a different duration with respect to the excitation time. The intensity response of the MR signals typically varies over time. The verification of the acquired first calibration data 71 in method step 150 may comprise analyzing the time sequence of the intensity of the MR signals of the at least two echoes with respect to a continuous reduction, e.g. with respect to an exponential reduction. In the case shown, the first calibration data 71 does not show a continuously-reduced intensity of the MR signals. The intensity of the MR signals of the first two echoes after the excitation time is lower than that of the subsequent echoes. This typically indicates that these MR signals are outside the sensitivity range of the ADC 35, e.g. by application of the first gain factor in the amplifier unit 34. Consequently, in the case shown, the first calibration data 71 is partially outside the sensitivity range of the ADC 35.

In the case shown, the second calibration data 72 in each case comprises MR signals acquired for seven echoes, each having a different time duration relative to the excitation time. In the case shown, the second calibration data 72 exhibits a continuously-reduced MR signal intensity. This typically indicates that the second calibration data 72 is within the sensitivity range of the ADC 35, e.g. due to application of the second gain factor in the amplifier unit 34. The checking of the acquired first calibration data 71 in method step 150 may include comparing, using method step 151, the acquired first calibration data 71 with the acquired second calibration data 72, e.g. determining a scaling factor between the acquired first calibration data 71 and the acquired second calibration data 72. The first calibration data 71 cannot be mapped to the second calibration data 72 solely by a scaling factor. This typically indicates that the first calibration data 71 is at least partially outside the sensitivity range of the ADC 35, e.g. by application of the first gain factor in the amplifier unit 34.

Although the disclosure has been illustrated and described in detail by the preferred embodiments, the disclosure is not limited by the examples disclosed and other variations will be apparent to persons in the art without departing from the scope of protection sought for the disclosure.

The various components described herein may be referred to as "units." As described herein, these components may be implemented via any suitable combination of hardware and software components. This may include FPGAs, processors, processing circuitry, or other suitable hardware components configured to execute instructions or computer programs that are stored on a suitable computer readable medium. Regardless of their particular implementation, these components may alternatively be referred to herein as processors or processing circuitry.

What is claimed is:

1. A method for acquiring magnetic resonance (MR) data of an examination object via a MR device, the MR data comprising first MR data and second MR data, the method comprising:
   generating, using a MR control sequence comprising a multi-echo sequence, (i) the first MR data having a first phase encoding using a first phase encoding gradient, and (ii) the second MR data having a second phase encoding using a second phase encoding gradient;
   executing a calibration sequence comprising a multi-echo sequence for generating first calibration data of the examination object;
   acquiring, via an amplifier associated with the MR device using a first gain factor, the first calibration data comprising signals of at least two echoes having different time durations with respect to an excitation time;
   verifying the acquired first calibration data for compatibility with a sensitivity range of an analog-to-digital converter (ADC) associated with the MR device to generate a verification result by analyzing a reduction in an intensity of the signals of the at least two echoes within a time sequence of the acquired first calibration data;
   selecting an amplifier gain setting depending on the verification result, the amplifier gain setting including at least one selected from the group of (i) the first gain factor for acquiring the MR data, (ii) the first gain factor for acquiring the first MR data and a second gain factor for acquiring the second MR data, and (iii) a second gain factor for acquiring the MR data; and
   executing the MR control sequence to acquire the MR data of the examination object using the selected amplifier gain setting.

2. The method as claimed in claim 1, wherein the first gain factor is greater than the second gain factor, and
   wherein the first phase encoding gradient is greater than the second phase encoding gradient.

3. The method as claimed in claim 1, wherein the calibration sequence corresponds at least partially to the MR control sequence lacking phase encoding.

4. The method as claimed in claim 1, wherein the act of executing the calibration sequence further comprises executing the calibration sequence for generating second calibration data, and further comprising:
   acquiring, via the amplifier associated with the MR device using a second gain factor, the second calibration data.

5. The method as claimed in claim 4, wherein the act of verifying the acquired first calibration data comprises determining a scaling factor between the acquired first calibration data and the acquired second calibration data.

6. The method as claimed in claim 1, wherein the act of selecting the amplifier gain setting comprises selecting the first gain factor when the acquired first calibration data is within the sensitivity range of the ADC.

7. The method as claimed in claim 6, further comprising:
   performing phase correction of the MR data using the first calibration data.

8. The method as claimed in claim 1, wherein the act of selecting the amplifier gain setting comprises selecting the second gain factor for acquiring the MR data when the first calibration data is outside the sensitivity range of the ADC.

9. The method as claimed in claim 8, further comprising:
   performing phase correction of the MR data using the second calibration data.

10. The method as claimed in claim 1, wherein the act of selecting the amplifier gain setting comprises:
    when the first calibration data is partially outside the sensitivity range of the ADC, selecting (i) the first gain factor for acquiring the first MR data, and (ii) the second gain factor for acquiring the second MR data.

11. The method as claimed in claim 1, wherein the act of selecting the amplifier gain setting comprises selecting the amplifier gain setting based upon a comparison of the first phase encoding gradient and/or the second phase encoding gradient to a threshold value.

12. A magnetic resonance (MR) device for acquiring MR data of an examination object, the MR data comprising first MR data and second MR data, the MR device comprising:
- a main magnet surrounding an examination space configured to accept the examination object;
- an amplifier;
- an analog-to-digital converter (ADC); and
- processing circuitry configured to cause the MR device to:
  - generate, using a MR control sequence comprising a multi-echo sequence, (i) the first MR data having a first phase encoding using a first phase encoding gradient, and (ii) the second MR data having a second phase encoding using a second phase encoding gradient;
  - execute a calibration sequence comprising a multi-echo sequence for generating first calibration data of the examination object;
  - acquire, via the amplifier using a first gain factor, the first calibration data comprising signals of at least two echoes having different time durations with respect to an excitation time;
  - verify the acquired first calibration data for compatibility with a sensitivity range of the ADC to generate a verification result by analyzing a reduction in an intensity of the signals of the at least two echoes within a time sequence of the acquired first calibration data;
  - select an amplifier gain setting depending on the verification result, the amplifier gain setting including at least one selected from the group of (i) the first gain factor for acquiring the MR data, (ii) the first gain factor for acquiring the first MR data and a second gain factor for acquiring the second MR data, and (iii) a second gain factor for acquiring the MR data; and
  - execute the MR control sequence to acquire the MR data of the examination object using the selected amplifier gain setting.

13. A non-transitory computer-readable medium associated with a magnetic resonance (MR) device for acquiring MR data of an examination object that includes first MR data and second MR data that, when executed by processing circuitry associated with the MR device, cause the MR device to:
- generate, using a MR control sequence comprising a multi-echo sequence, (i) the first MR data having a first phase encoding using a first phase encoding gradient, and (ii) the second MR data having a second phase encoding using a second phase encoding gradient;
- execute a calibration sequence comprising a multi-echo sequence for generating first calibration data of the examination object;
- acquire, via the amplifier using a first gain factor, the first calibration data comprising signals of at least two echoes having different time durations with respect to an excitation time;
- verify the acquired first calibration data for compatibility with a sensitivity range of the ADC to generate a verification result by analyzing a reduction in an intensity of the signals of the at least two echoes within a time sequence of the acquired first calibration data;
- select an amplifier gain setting depending on the verification result, the amplifier gain setting including at least one selected from the group of (i) the first gain factor for acquiring the MR data, (ii) the first gain factor for acquiring the first MR data and a second gain factor for acquiring the second MR data, and (iii) a second gain factor for acquiring the MR data; and
- execute the MR control sequence to acquire the MR data of the examination object using the selected amplifier gain setting.

* * * * *